United States Patent
Cho et al.

(10) Patent No.: US 9,858,860 B2
(45) Date of Patent: Jan. 2, 2018

(54) ORGANIC LIGHT-EMITTING DIODE DISPLAY

(71) Applicant: Samsung Display Co., Ltd., Yongin-si, Gyeonggi-do (KR)

(72) Inventors: Sung Ho Cho, Seoul (KR); Dong-Yoon So, Asan-si (KR); Tae Gon Kim, Cheonan-si (KR); Kyong Tae Park, Suwon-si (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 9 days.

(21) Appl. No.: 14/992,896

(22) Filed: Jan. 11, 2016

(65) Prior Publication Data

US 2016/0335955 A1 Nov. 17, 2016

(30) Foreign Application Priority Data

May 14, 2015 (KR) ........................ 10-2015-0067480

(51) Int. Cl.
  *G09G 3/3275* (2016.01)
  *G09G 3/3233* (2016.01)
  *H01L 27/32* (2006.01)

(52) U.S. Cl.
  CPC ..... *G09G 3/3233* (2013.01); *G09G 2300/0819* (2013.01); *G09G 2300/0842* (2013.01); *G09G 2300/0861* (2013.01); *G09G 2330/08* (2013.01); *G09G 2330/10* (2013.01); *H01L 27/3279* (2013.01); *H01L 2251/568* (2013.01)

(58) Field of Classification Search
  CPC .......... H01L 2251/568; G09G 2330/10; G09G 2300/0413; G09G 2330/08
  See application file for complete search history.

(56) References Cited

U.S. PATENT DOCUMENTS

| | | | |
|---|---|---|---|
| 2009/0262049 A1* | 10/2009 | Yoon | H01L 27/3276 345/76 |
| 2013/0256676 A1* | 10/2013 | Jin | H01L 27/3262 257/72 |

(Continued)

FOREIGN PATENT DOCUMENTS

| | | |
|---|---|---|
| KR | 10-2007-0107472 A | 11/2007 |
| KR | 10-2008-0022357 A | 3/2008 |

(Continued)

*Primary Examiner* — Abbas Abdulselam
(74) *Attorney, Agent, or Firm* — Knobbe Martens Olson & Bear LLP

(57) ABSTRACT

An organic light-emitting diode display is disclosed. In one aspect, the display includes a substrate including a display area configured to display an image and a peripheral area surrounding the display area, a plurality of scan lines formed over the substrate and a plurality of data lines crossing the scan lines. A plurality of pixels is formed in the display area and electrically connected to the scan lines and the data lines, a repair ring is formed in the peripheral area and surrounding the display area, and the repair ring includes a first portion and a connecting portion different from the first portion. The first portion has a width less than that of the connecting portion different from the first portion. A driving circuit is configured to generate a data signal that is output to the data lines and the repair ring.

19 Claims, 12 Drawing Sheets

(56) References Cited

U.S. PATENT DOCUMENTS

| | | | |
|---|---|---|---|
| 2014/0068925 A1* | 3/2014 | Park | G02F 1/1309 29/593 |
| 2014/0117860 A1* | 5/2014 | Kim | H01L 27/3276 315/169.1 |
| 2015/0154899 A1* | 6/2015 | Chang | G09G 3/3233 345/76 |

FOREIGN PATENT DOCUMENTS

| KR | 10-2008-0022716 A | 3/2008 |
|---|---|---|
| KR | 10-2010-0065745 A | 6/2010 |
| KR | 10-1202982 B1 | 11/2012 |
| KR | 10-2015-0021773 A | 3/2015 |

\* cited by examiner

ORGANIC LIGHT-EMITTING DIODE DISPLAY

INCORPORATION BY REFERENCE TO ANY PRIORITY APPLICATIONS

This application claims priority to and the benefit of Korean Patent Application No. 10-2015-0067480 filed in the Korean Intellectual Property Office on May 14, 2015, the entire contents of which are incorporated herein by reference.

BACKGROUND

Field

The described technology generally relates to an organic light-emitting diode display.

Description of the Related Technology

An organic light-emitting diode (OLED) includes two electrodes and an interposed organic emission layer. An electron injected from a cathode electrode and a hole injected from an anode electrode are coupled to each other in the organic emission layer to generate an exciton, and light is emitted by emitting energy of the exciton.

An OLED display includes a matrix of pixel circuits, each one including an OLED configured by the cathode, the anode, and the organic emission layer. In each pixel, transistors and one or more capacitors for driving the OLED are formed.

Pixel defects can be generated due to a characteristic deviation between different pixel elements (circuits), or disconnection or short-circuit between wires. In this case, in order to repair the defective pixel, a repair ring is formed at the peripheral portion of the OLED display. The repair ring is also formed in an overlapping portion of an extension line of the wire where the pixel defect is generated and the repair ring is short-circuited by using a laser beam or the like.

However, since the OLED display is driven by current, the problem of a signal through the repair ring having an undesired voltage drop can arise.

The above information disclosed in this Background section is only for enhancement of understanding of the background of the described technology and therefore it can contain information that does not constitute the prior art that is already known in this country to a person of ordinary skill in the art.

SUMMARY OF CERTAIN INVENTIVE ASPECTS

One inventive aspect relates to an OLED display that can suppress a voltage drop from being generated in the signal through the repair ring.

Another aspect is an OLED display including: a substrate including a display portion displaying an image and a peripheral portion surrounding the display portion; a plurality of scan lines formed on the substrate and extended in a first direction; a plurality of data lines crossing the plurality of scan lines and extended in a second direction; a plurality of pixels formed in the display portion and connected to the plurality of scan lines and the plurality of data lines, respectively; a repair ring formed in the peripheral portion to surround the display portion and including a first part having a smaller width than another part; and a driving circuit transferring a data signal to the plurality of data lines and the repair ring.

The OLED display can further include a first peripheral signal line formed in the peripheral portion and overlapping the first part of the repair ring.

The first part of the repair ring can be adjacent to the driving circuit.

The repair ring can further include a second part exposed by at least one contact hole formed in an insulating layer covering the repair ring.

The repair ring can further include a contact portion extended in a parallel direction with the second part to contact the second part through at least one contact hole.

The OLED display can further include a scan circuit formed in the peripheral portion to be connected to the plurality of scan lines, in which the second part of the repair ring can be adjacent to the scan circuit.

The repair ring can further include a third part crossing the plurality of data lines in the peripheral portion, and a second peripheral signal line formed in the peripheral portion and including an opening corresponding to the third part of the repair ring.

The third part of the repair ring can be spaced apart from the driving circuit with the display portion therebetween.

The driving circuit can transfer the same data signal as the data signal transferred to an error data line among the plurality of data lines to the repair ring.

The repair ring can be divided into a left repair ring and a right repair ring.

Another aspect is an OLED display including: a substrate including a display portion displaying an image and a peripheral portion surrounding the display portion; a plurality of scan lines formed on the substrate and extended in a first direction; a plurality of data lines crossing the plurality of scan lines and extended in a second direction; a plurality of pixels formed in the display portion and connected to the plurality of scan lines and the plurality of data lines, respectively; a repair ring formed in the peripheral portion to surround the display portion and including one part exposed by at least one contact hole formed in an insulating layer covering the repair ring; and a driving circuit transferring a data signal to the plurality of data lines and the repair ring.

The repair ring can further include a contact portion extended in a parallel direction with one part to contact one part through at least one contact hole.

The OLED display can further include a scan circuit formed in the peripheral portion to be connected to the plurality of scan lines, in which one part of the repair ring can be adjacent to the scan circuit.

The repair ring can further include the other part crossing the plurality of data lines in the peripheral portion, and a peripheral signal line formed in the peripheral portion and including an opening corresponding to the other part of the repair ring.

The other part of the repair ring can be spaced apart from the driving circuit with the display portion therebetween.

Another aspect is an OLED display including: a substrate including a display portion displaying an image and a peripheral portion surrounding the display portion; a plurality of scan lines formed on the substrate and extended in a first direction; a plurality of data lines crossing the plurality of scan lines and extended in a second direction; a plurality of pixels formed in the display portion and connected to the plurality of scan lines and the plurality of data lines, respectively; a repair ring formed in the peripheral portion to surround the display portion and including one part crossing the plurality of data lines in the peripheral portion; a driving circuit transferring a data signal to the plurality of data lines and the repair ring; and a peripheral signal line formed in the peripheral portion and including an opening corresponding to one part of the repair ring.

One part of the repair ring can be spaced apart from the driving circuit with the display portion therebetween.

Another aspect is an organic light-emitting diode (OLED) display, comprising: a substrate including a display area configured to display an image and a peripheral area surrounding the display area; a plurality of scan lines formed over the substrate; a plurality of data lines crossing the scan lines; a plurality of pixels formed in the display area and electrically connected to the scan lines and the data lines; a repair ring formed in the peripheral area and surrounding the display area, wherein the repair ring includes a first portion and a connecting portion different from the first portion, and wherein the first portion has a width less than that of the connecting portion different from the first portion; and a driving circuit configured to generate a data signal that is output to the data lines and the repair ring.

The above OLED display further comprises a first peripheral signal line formed in the peripheral area and overlapping the first portion of the repair ring in the depth dimension of the OLED display.

In the above OLED display, the first portion of the repair ring is located adjacent to the driving circuit.

In the above OLED display, the connecting portion comprises a pair of connecting portions, wherein the first portion has opposing ends respectively connected to the connecting portions, and wherein the connection portions do not overlap the first portion in the depth dimension of the OLED display.

The above OLED display further comprises an insulating layer formed over the repair ring and including at least one contact hole, wherein the repair ring further includes a second portion contacting a bottom portion of the contact hole.

In the above OLED display, the repair ring further includes a contact portion formed over the repair ring, and wherein the contact portion contacts the second portion through the contact hole.

The above OLED display further comprises a scan circuit formed in the peripheral area and electrically connected to the scan lines, wherein the second portion of the repair ring is located adjacent to the scan circuit.

In the above OLED display, the repair ring further includes a third portion crossing the data lines in the peripheral area, wherein a second peripheral signal line is formed in the peripheral area and includes an opening corresponding to the third portion of the repair ring.

In the above OLED display, the third portion of the repair ring is spaced apart from the driving circuit with the display area interposed therebetween.

In the above OLED display, the driving circuit is further configured to transfer the data signal transferred to an error data line of the data lines to the repair ring.

In the above OLED display, the repair ring comprises a left repair ring and a right repair ring.

In the above OLED display, the left and right repair rings respectively correspond to left and right halves of the display area.

In the above OLED display, the left repair ring is electrically connected to a left portion of the driving circuit, wherein the right repair ring is electrically connected to a right portion of the driving circuit.

Another aspect is an OLED display, comprising: a substrate including a display area configured to display an image and a peripheral area surrounding the display area; a plurality of scan lines formed over the substrate; a plurality of data lines crossing the scan lines; a plurality of pixels formed in the display area and electrically connected to the scan lines and the data lines; a repair ring formed in the peripheral area and surrounding the display area, wherein the repair ring includes a first portion and contacts an insulating layer at least partially covering the repair ring; and a driving circuit configured to transfer a data signal to the data lines and the repair ring.

In the above OLED display, the repair ring further includes a contact portion formed over the substrate and contacts the first portion through at least one contact hole.

The above OLED display further comprises a scan circuit formed in the peripheral area and electrically connected to the scan lines, wherein the first portion of the repair ring is located adjacent to the scan circuit.

In the above OLED display, the repair ring further includes the a second portion different from the first portion, wherein the second portion crosses the data lines in the peripheral area, and wherein the OLED display further comprises a peripheral signal line formed in the peripheral area and including an opening corresponding to the second portion of the repair ring.

In the above OLED display, the second portion of the repair ring is spaced apart from the driving circuit with the display portion interposed therebetween.

Another aspect is an organic light-emitting diode (OLED) display, comprising: a substrate including a display area configured to display an image and a non-display area surrounding the display area; a plurality of scan lines formed over the substrate; a plurality of data lines crossing the scan lines; a plurality of pixels formed in the display area and electrically connected to the scan lines and the data lines; a repair ring formed in the non-display area and surrounding the display area, wherein the repair ring includes a portion crossing the data lines in the non-display area; a driving circuit configured to transfer a data signal to the data lines and the repair ring; and a peripheral signal line formed in the peripheral area and including an opening corresponding to the portion of the repair ring.

In the above OLED display, the portion of the repair ring is spaced apart from the driving circuit with the display portion interposed therebetween.

Another aspect is an organic light-emitting diode (OLED) display, comprising: a substrate including a display area configured to display an image and a peripheral area surrounding the display area; a repair ring formed in the peripheral area and surrounding the display area, wherein the repair ring includes a first portion and a connecting portion different from the first portion, wherein the first portion has a width less than that of the connecting portion different from the first portion, wherein the connecting portion comprises a pair of connecting portions, wherein the first portion has opposing ends respectively connected to the connecting portions, and wherein the connection portions do not overlap the first portion in the depth dimension of the OLED display; and a driving circuit configured to transfer a data signal to the data lines and the repair ring.

According to at least one of the disclosed embodiments, it is possible to provide the OLED display which suppresses a voltage drop from being generated in the signal through the repair ring.

DETAILED DESCRIPTION OF CERTAIN INVENTIVE EMBODIMENTS

Figure 1:
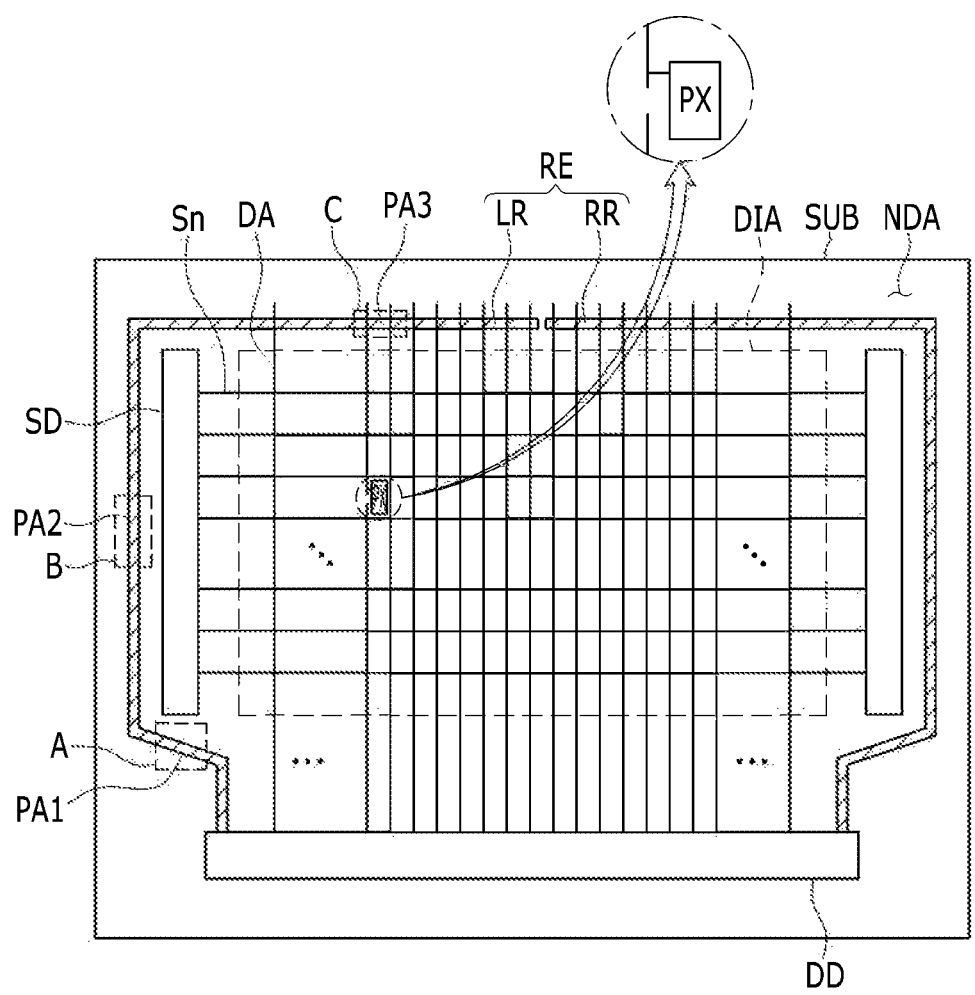
FIG. 1 is a plan view illustrating an OLED display according to an exemplary embodiment.

The described technology will be described more fully hereinafter with reference to the accompanying drawings, in which exemplary embodiments of the described technology are shown. As those skilled in the art would realize, the described embodiments can be modified in various different ways, all without departing from the spirit or scope of the described technology.

Accordingly, the drawings and description are to be regarded as illustrative in nature and not restrictive. Like reference numerals designate like elements throughout the specification.

In addition, the size and thickness of each configuration shown in the drawings are arbitrarily shown for understanding and ease of description, but the described technology is not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements can also be present.

In addition, unless explicitly described to the contrary, the word "comprise" and variations such as "comprises" or "comprising", will be understood to imply the inclusion of stated elements but not the exclusion of any other elements. Further, throughout the specification, the word "on" means positioning on or below the object portion, but does not essentially mean positioning on the upper side of the object portion based on a gravity direction. In this disclosure, the term "substantially" includes the meanings of completely, almost completely or to any significant degree under some applications and in accordance with those skilled in the art. The term "connected" can include an electrical connection.

Hereinafter, an OLED display according to an exemplary embodiment will be described with reference to FIGS. 1 to 6.

FIG. 1 is a plan view illustrating an OLED display according to an exemplary embodiment.

As illustrated in FIG. 1, an OLED display according to an exemplary embodiment includes a substrate SUB, and a plurality of scan lines Sn, a plurality of data lines DA, a plurality of pixels PX, a repair ring RE, a scan circuit SD, and a driving circuit DD, which are formed on the substrate SUB.

The substrate SUB includes a display portion (or display area) DIA displaying an image and a peripheral portion NDA surrounding the display portion DIA. The scan lines Sn, the data lines DA, the pixels PX are formed in the display portion DIA, and ends of the scan lines Sn, ends of the data lines DA, the repair ring RE, the scan circuit SD, and the driving circuit DD are formed in the peripheral portion NDA.

The scan line Sn transfers a scan signal and extends in a horizontal direction which is a first direction. The data line DA transfers a data signal, crosses the scan line Sn, and is extended in a vertical direction which is a second direction crossing the first direction.

The pixel PX includes a pixel circuit portion connected to the scan line Sn and the data line DA, and an OLED connected to the pixel circuit portion. The pixel circuit portion includes a plurality of thin film transistors and at least one capacitor for driving the OLED. The OLED includes a cathode, an anode, and an organic emission layer.

For convenience of description, although not illustrated in FIG. 1, each of the pixels PX can be connected to each of the scan lines supplying different scan signals, and furthermore, can be connected to a driving power line supplying a voltage and an initialization power line. Further, the cathode of the OLED included in each of the pixels PX can be connected to a common power source. A detailed structure of each of the pixels PX will be described below. The scan lines, the driving power line, and the initialization power line described above will be described below, but are not limited thereto and can be connected to each of the pixels PX in various known forms.

Figure 2:
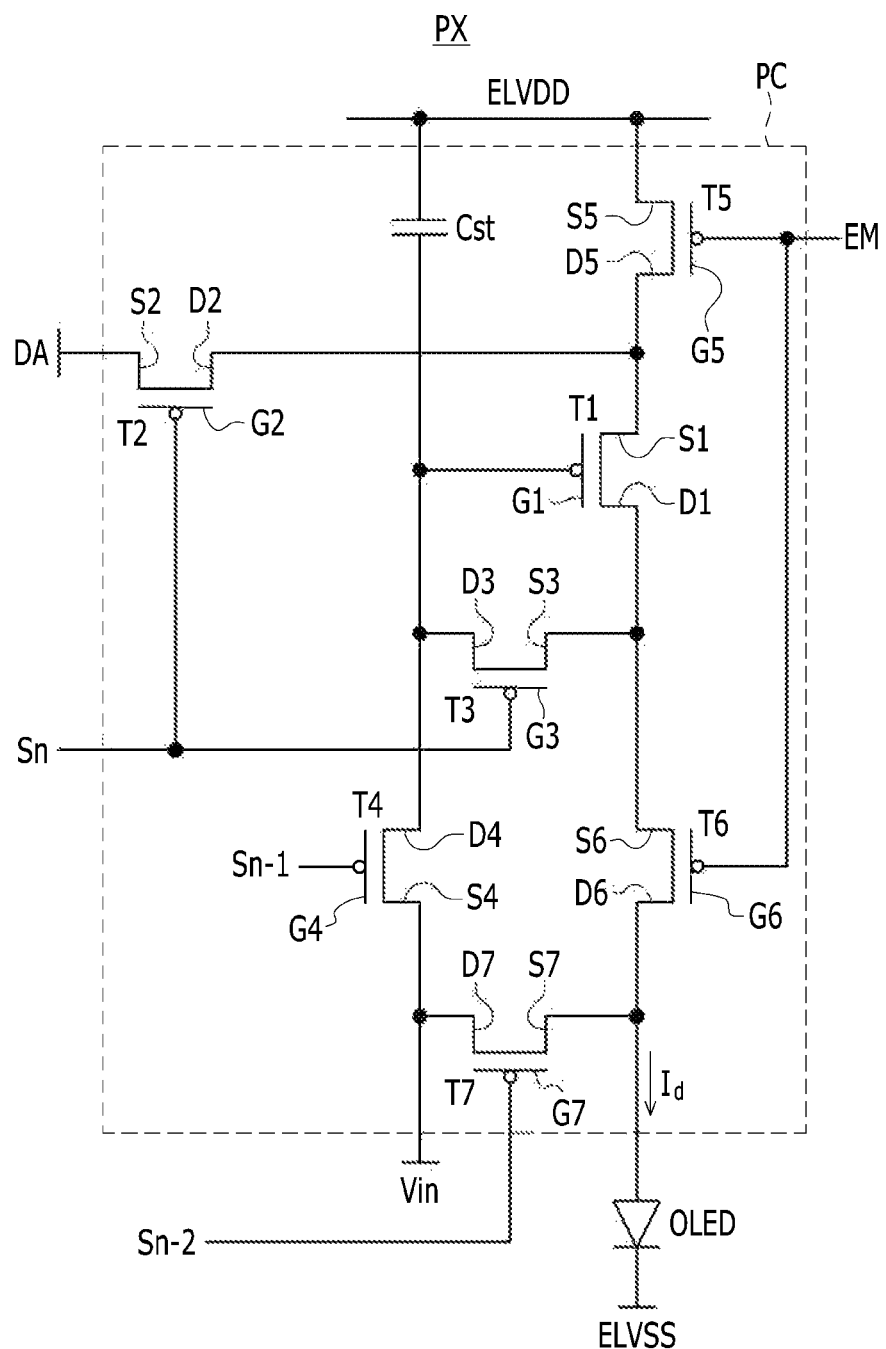
FIG. 2 is a circuit diagram of a pixel illustrated in FIG. 1.

FIG. 2 is a circuit diagram of a pixel illustrated in FIG. 1.

As illustrated in FIG. 2, the pixel PX includes a pixel circuit PC including a plurality of thin film transistors T1, T2, T3, T4, T5, T6, and T7, which are selectively connected to a plurality of lines Sn, Sn-1, Sn-2, EM, Vin, DA, and ELVDD, and a capacitor Cst, and an OLED connected to the pixel circuit PC.

The plurality of thin film transistors T1, T2, T3, T4, T5, T6, and T7 includes a first thin film transistor T1, a second thin film transistor T2, a third thin film transistor T3, a fourth thin film transistor T4, a fifth thin film transistor T5, a sixth thin film transistor T6, and a seventh thin film transistor T7.

A first gate electrode G1 of the first thin film transistor T1 is connected to a third drain electrode D3 of the third thin film transistor T3 and a fourth drain electrode D4 of the fourth thin film transistor T4, respectively, a first source electrode S1 is connected to a second drain electrode D2 of the second thin film transistor T2 and a fifth drain electrode D5 of the fifth thin film transistor T5, respectively, and a first drain electrode D1 is connected to a third source electrode S3 of the third thin film transistor T3 and a sixth source electrode S6 of the sixth thin film transistor T6, respectively.

A second gate electrode G2 of the second thin film transistor T2 is connected to a first scan line Sn, a second source electrode S2 is connected to the data line DA, and a second drain electrode D2 is connected to the first source electrode S1 of the first thin film transistor T1.

A third gate electrode G3 of the third thin film transistor T3 is connected to the first scan line Sn, a third source electrode S3 is connected to a first drain electrode D1 of the first thin film transistor T1, and a third drain electrode D3 is connected to a first gate electrode G1 of the first thin film transistor T1.

A fourth gate electrode G4 of the fourth thin film transistor T4 is connected to a second scan line Sn-1, a fourth source electrode S4 is connected to the initialization power line Vin, and a fourth drain electrode D4 is connected to the first gate electrode G1 of the first thin film transistor T1.

A fifth gate electrode G5 of the fifth thin film transistor T5 is connected to a light emission control line EM, a fifth source electrode S5 is connected to a driving power line ELVDD, and a fifth drain electrode D5 is connected to the first source electrode S1 of the first thin film transistor T1.

A sixth gate electrode G6 of the sixth thin film transistor T6 is connected to the light emission control line EM, and a sixth source electrode S6 is connected to the first drain electrode D1 of the first thin film transistor T1.

A seventh gate electrode G7 of the seventh thin film transistor T7 is connected to a third scan line Sn-2, a seventh source electrode S7 is connected to the OLED, and a seventh drain electrode D7 is connected to a fourth source electrode S4 of the fourth thin film transistor T4.

The scan lines can include a first scan line Sn transferring a first scan signal to the second gate electrode G2 and the third gate electrode G3 of the second thin film transistor T2 and the third thin film transistor T3. The scan lines also include a second scan line Sn-1 transferring a second scan signal to the fourth gate electrode G4 of the fourth thin film transistor T4, a third scan line Sn-2 transferring a third scan signal to the seventh gate electrode G7 of the seventh thin film transistor T7, and a light emission control line EM transferring a light emission control signal to the fifth gate electrode G5 and the sixth gate electrode G6 of the fifth thin film transistor T5 and the sixth thin film transistor T6, respectively.

The capacitor Cst includes one electrode connected to the driving power line ELVDD, and the other electrode connected to the first gate electrode G1 and the third drain electrode D3 of the third thin film transistor T3.

The OLED includes an anode, a cathode, and an organic emission layer positioned between both electrodes. The anode of the OLED is connected to the seventh source electrode S7 of the seventh thin film transistor T7 and the sixth drain electrode D6 of the sixth thin film transistor T6, respectively, and the cathode is connected to the common power source ELVSS to which the common signal is transferred.

As an example of the driving of the pixel, first, when the third scan signal is transferred to the third scan line Sn-2 to turn on the seventh thin film transistor T7, a remaining current flowing in the anode of the OLED is discharged to the fourth thin film transistor T4 through the seventh thin film transistor T7, thereby suppressing undesired light emission of the OLED due to the remaining current flowing in the anode of the OLED.

Next, when the second scan signal is transferred to the second scan line Sn-1 and an initialization signal is transferred to the initialization power line Vin, the fourth thin film transistor T4 is turned on. An initialization voltage due to the initialization signal is supplied to the first gate electrode G1 of the first thin film transistor T1 and the other electrode of the capacitor Cst through the fourth thin film transistor T4, and as a result, the first gate electrode G1 and the capacitor Cst are initialized. In this case, while the first gate electrode G1 is initialized, the first thin film transistor T1 is turned on.

Next, when the first scan signal is transferred to the first scan line Sn and the data signal is transferred to the data line DA, the second thin film transistor T2 and the third thin film transistor T3 are turned on. Also, a data voltage Vd due to the data signal is supplied to the first gate electrode G1 through the second thin film transistor T2, the first thin film transistor T1, and the third thin film transistor T3. In this case, the voltage supplied to the first gate electrode G1 is supplied as a compensation voltage Vd+Vth (Vth is a negative (−) value) which is the data voltage Vd supplied from the initial data line DA reduced by a threshold voltage Vth of the first thin film transistor T1. The compensation voltage Vd+Vth supplied to the first gate electrode G1 is supplied even to the other electrode of the capacitor Cst connected to the first gate electrode G1.

Next, a driving voltage Vel due to the driving signal is supplied to one electrode of the capacitor Cst from the driving power line ELVDD, the aforementioned compensation voltage Vd+Vth is supplied to the other electrode, and as a result, a charge corresponding to a difference between voltages applied to both electrodes is stored in the capacitor Cst and the first thin film transistor T1 is turned on for a predetermined time.

Next, when the light emission control signal is applied to the light emission control line EM, each of the fifth thin film transistor T5 and the sixth thin film transistor T6 is turned on and then the driving voltage Vel due to the driving signal is supplied to the first thin film transistor T1 through the fifth thin film transistor T5 from the driving power line ELVDD.

Then, while the driving voltage Vel passes through the first thin film transistor T1 which is turned on by the capacitor Cst, a driving current ld corresponding to a voltage difference between the voltage supplied to the first gate electrode G1 by the capacitor Cst and the driving voltage Vel flows in the first drain electrode D1 of the first thin film transistor T1, and the driving current ld is supplied to the OLED through the sixth thin film transistor T6 and the OLED emits light for a predetermined time.

Meanwhile, the pixel circuit PC of one pixel PX of the OLED display according to the exemplary embodiment is configured by the first thin film transistor T1 to the seventh thin film transistor T7 which are selectively connected to the first scan line Sn to the third scan line Sn-2, the data line DA, the driving power line ELVDD, the initialization power line Vin, and the capacitor Cst, but is not limited thereto. A pixel circuit of one pixel of an OLED display according to another exemplary embodiment can be configured by a plurality of thin film transistors which is selectively connected to lines including one or more scan lines and one or more data lines, and one or more capacitors.

Referring back to FIG. 1, the repair ring RE is formed in the peripheral portion NDA to surround the display portion DIA. The repair ring RE crosses the end of each of the data lines DA and is separated from a left repair ring LR and a right repair ring RR in order to prevent a signal delay.

The scan circuit SD is formed at the peripheral portion NDA of the substrate SUB and connected to the scan lines Sn. The scan circuit SD is connected to the end of the scan lines Sn and transfers the scan signal to each of the scan lines Sn. In FIG. 1, two scan circuits SD are positioned to face each other with the display portion DIA therebetween, but are not limited thereto and the scan circuit SD can be one or three or more.

The driving circuit DD is connected to the data lines DA and the repair ring RE to transfer the data signal to the data lines DA and the repair ring RE, respectively. The driving circuit DD can include a timing controller.

In this structure, the same data signal as the data signal transferred to an error data line by using the driving circuit is transferred to the error data line through the repair ring to drive the error data line. However, to this end, a repair process of short-circuiting the error data line and the repair ring is required. The repair process will be described below.

Hereinafter, a repair method of the OLED display according to the exemplary embodiment will be described with reference to FIG. 3.

Figure 3:
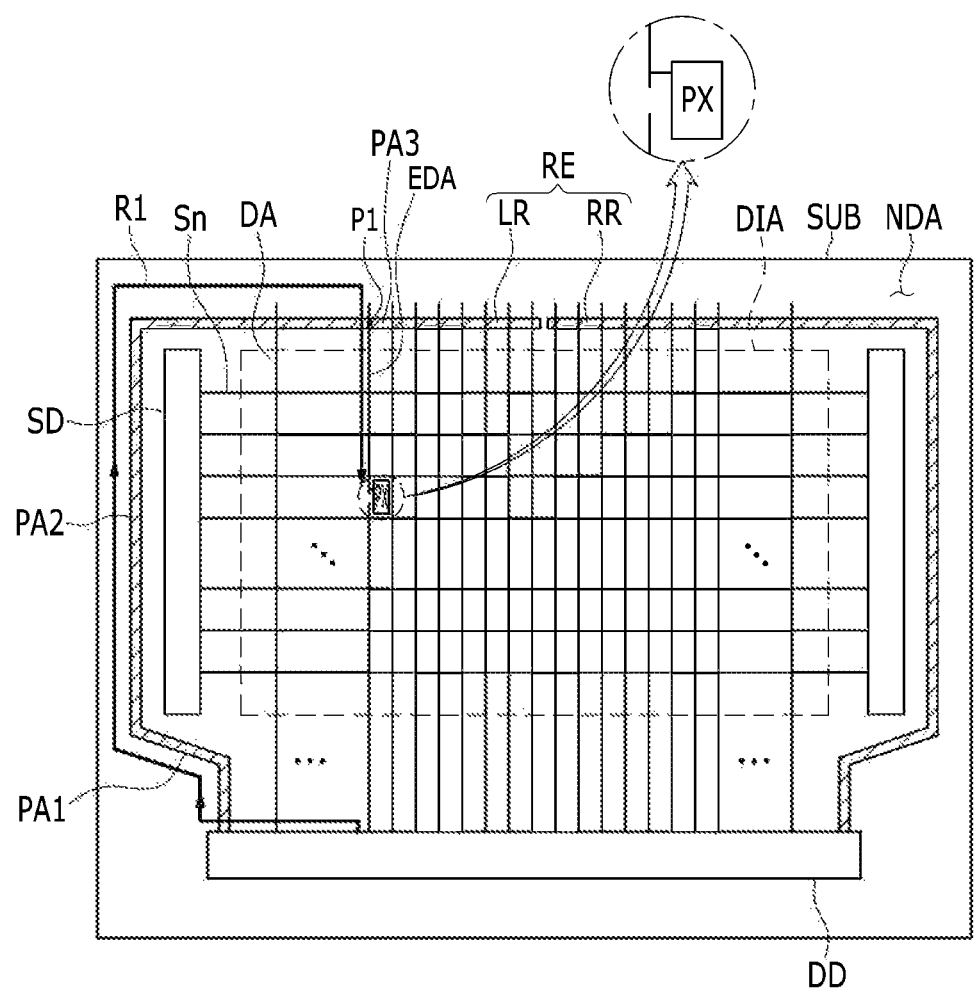
FIG. 3 is a plan view illustrating a repair method of an OLED display according to an exemplary embodiment.

FIG. 3 is a plan view illustrating a repair method of the OLED display according to an exemplary embodiment.

As illustrated in FIG. 3, in the repair method of the OLED display according to the exemplary embodiment, first, errors of the plurality of data lines of the OLED display according to the exemplary embodiment is inspected. In this case, the errors of the plurality of data lines can be inspected by using a method such as visual inspection.

Next, the repair ring RE crossing the detected error data line EDA is short-circuited at a cross point P1 of the error data line EDA and the repair ring RE. In this case, the error data line EDA and the repair ring RE can be short-circuited by using a laser and the like.

Next, the same data signal as the data signal transferred to the error data line EDA is transferred to the repair ring RE by using the driving circuit DD. In this case, in order to prevent a transfer path of the data signal from being increased, the repair process can be performed by using the left repair ring LR at the error data line EDA positioned at the left side of the display portion DIA and the right repair ring RR at the error data line EDA positioned at the right side of the display portion DIA.

Accordingly, the same data signal as the data signal transferred to the error data line EDA is transferred to the error data line EDA through the repair ring RE by using the driving circuit DD. That is, as illustrated in FIG. 3, a voltage drop is minimized and thus the data signal is transferred to the pixel PX through a first repair path R1.

Meanwhile, in the exemplary embodiment, the same data signal as the data signal transferred to the error data line EDA is transferred to the repair ring RE by using only the driving circuit DD, but the described technology is not limited thereto. In another exemplary embodiment, the same data signal as the data signal transferred to the error data line can be transferred to the repair ring RE by using a separate additional driving circuit.

Meanwhile, in FIG. 1, for convenience of description, as the line formed in the peripheral portion NDA of the substrate SUB, the repair ring RE, the ends of the scan lines Sn, and the ends of the data lines DA are illustrated. However, as described with reference to FIG. 2, since the pixel circuit PC formed in one pixel PX is connected to the lines Sn, Sn-1, Sn-2, EM, Vin, DA, and ELVDD, various peripheral signal lines connected to one or more of the lines Sn, Sn-1, Sn-2, EM, Vin, DA, and ELVDD described above are formed in the peripheral portion NDA of the substrate SUB. In addition, an undesired capacitor is formed at a portion where various peripheral signal lines and the repair ring RE overlap each other to generate a voltage drop in the data signal through the repair ring RE.

Disclosed is an improved OLED display in order to suppress the voltage drop from being generated in the data signal through the repair ring RE, and a detailed form of the OLED display will be described below.

Figure 4:
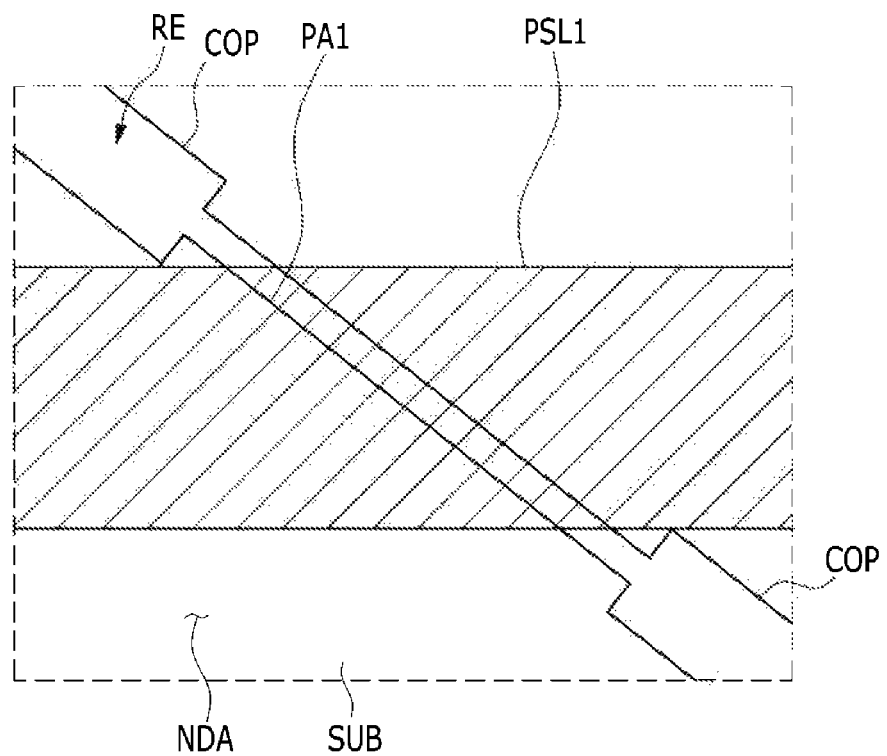
FIG. 4 is a plan view illustrating part A of FIG. 1.

FIG. 4 is a plan view illustrating part A of FIG. 1.

As illustrated in FIG. 4, the repair ring RE of the OLED display according to the exemplary embodiment includes a first part PA1. The OLED display further includes a first peripheral signal line PSL1 overlapping the first part PA1 of the repair ring RE, which is formed in the peripheral portion (or non-display area) NDA.

The first peripheral signal line PSL1 can be a peripheral signal line which is connected to at least one of the lines Sn, Sn-1, Sn-2, EM, Vin, DA, ELVDD, and ELVSS described with reference to FIG. 2, and cross the first part PA1 of the repair ring RE to overlap the first part PA1.

The first part PA1 of the repair ring RE is a part of the repair ring RE adjacent to the driving circuit DD and has a smaller width than another part of the repair ring RE. The first part PA1 can have opposing ends connected to connecting portions COP.

The first part PA1 of the repair ring RE overlapping the first peripheral signal line PSL1 has the smaller width than another part of the repair ring RE, and as a result, a capacitance formed between the first part PA1 of the repair ring RE and the first peripheral signal line PSL1 which overlap each other is minimized.

As a result, since the delay of the data signal through the first part PA1 of the repair ring RE is minimized by the capacitance formed by the first peripheral signal line PSL1, the voltage drop is suppressed from being generated in the data signal through the repair ring RE.

Figure 5:
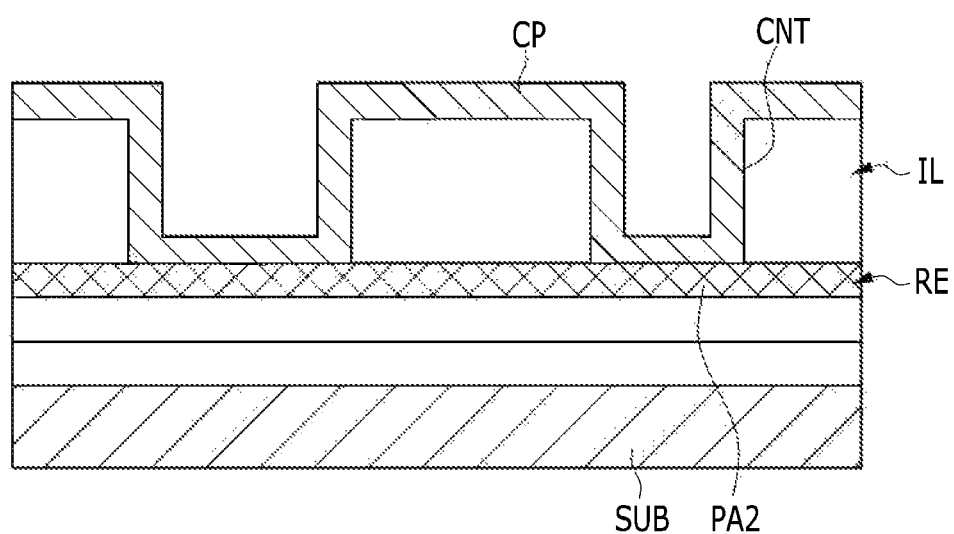
FIG. 5 is a cross-sectional view illustrating part B of FIG. 1.

FIG. 5 is a cross-sectional view illustrating part B of FIG. 1.

As illustrated in FIG. 5, the repair ring RE of the OLED display according to the exemplary embodiment further includes a second part PA2.

The second part PA2 of the repair ring RE is adjacent to the scan circuit SD, and the second part PA2 of the repair ring RE does not overlap the peripheral signal line connected to at least one of the lines Sn, Sn-1, Sn-2, EM, Vin, DA, ELVDD, and ELVSS.

At least a part of the second part PA2 of the repair ring RE is exposed by one or more contact holes CNT formed in an insulating layer IL covering the repair ring RE, and the repair ring RE further includes a contact portion CP which extends in a parallel direction with the second part PA2 to contact the second part PA2 through one or more contact holes CNT.

Here, the repair ring RE can be formed of a conductive layer positioned on the same layer as the aforementioned scan line Sn, and the contact portion CP can be formed by a conductive layer positioned on the same layer as the aforementioned data line DA, but the described technology is not limited thereto and can be formed of various conductive layers.

The second part PA2 of the repair ring RE which does not overlap the peripheral signal line contacts the contact portion CP through the contact hole CNT formed in the insulating layer IL, and as a result, electrical resistance of the second part PA2 of the repair ring RE is minimized.

As a result, since the delay of the data signal through the second part PA2 of the repair ring RE due to the electrical resistance of the second part PA2 of the repair ring RE is minimized, the voltage drop is suppressed from being generated in the data signal through the repair ring RE.

Figure 6:
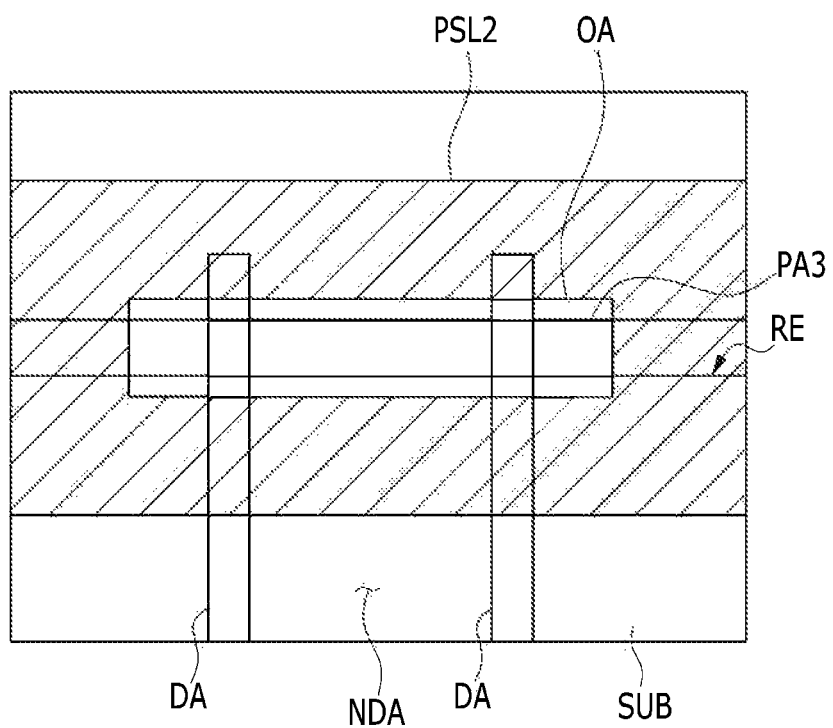
FIG. 6 is a plan view illustrating part C of FIG. 1.

FIG. 6 is a plan view illustrating part C of FIG. 1.

As illustrated in FIG. 6, the repair ring RE of the OLED display according to the exemplary embodiment further includes a third part PA3, and the OLED display further includes a second peripheral signal line PSL2 including an opening OA corresponding to the third part PA3 of the repair ring RE, which is formed in the peripheral portion NDA.

The second peripheral signal line PSL2 can be a peripheral signal line which is connected to at least one of the lines Sn, Sn-1, Sn-2, EM, Vin, DA, ELVDD, and ELVSS described with reference to FIG. 2, and includes the opening OA corresponding to the third part PA3 of the repair ring RE.

The third part PA3 of the repair ring RE is a part of the repair ring RE which is spaced apart from the driving circuit DD with the display portion DIA therebetween and a part crossing the data lines DA in the peripheral portion NDA.

The second peripheral signal line PSL2 includes the opening OA at the portion corresponding to the third part PA3 of the repair ring RE to prevent the capacitance from being formed between the third part PA3 of the repair ring RE and the second peripheral signal line PSL2.

As a result, since the data signal through the third part PA3 of the repair ring RE is prevented from being delayed due to the capacitance formed by the second peripheral signal line PSL2, the voltage drop is suppressed from being generated in the data signal through the repair ring RE.

Meanwhile, in the exemplary embodiment, each of the first part PA1, the second part PA2, and the third part PA3 of the repair ring RE is formed in the left repair ring LR of the left repair ring LR and the right repair ring RR, but is not limited thereto and can be formed even in the right repair ring RR.

In the OLED display according to the exemplary embodiment, the first part PA1 of the repair ring RE overlapping the first peripheral signal line PSL1 has a smaller width than another part of the repair ring RE, the second part PA2 of the repair ring RE which does not overlap the peripheral signal line contacts the contact portion CP through the contact hole CNT formed in the insulating layer IL, and the second peripheral signal line PSL2 includes the opening OA at the portion corresponding to the third part PA3 of the repair ring RE. As a result, since the capacitance formed between the first part PA1 of the repair ring RE and the first peripheral signal line PSL1 which overlap each other is minimized, the electrical resistance of the second part PA2 of the repair ring RE is minimized, and the capacitance is prevented from being formed between the third part PA3 of the repair ring RE and the second peripheral signal line PSL2, the voltage drop is suppressed from being generated in the data signal through each of the first part PA1, the second part PA2, and the third part PA3 of the repair ring RE and thus the voltage drop is suppressed from being generated in the data signal through the repair ring RE.

That is, it is possible to provide the OLED display which suppresses a voltage drop from being generated in a signal through the repair ring RE.

Hereinafter, an OLED display according to another exemplary embodiment will be described with reference to FIGS. 7 and 8. Hereinafter, different parts from the OLED display according to the exemplary embodiment described above will be described.

Figure 7:
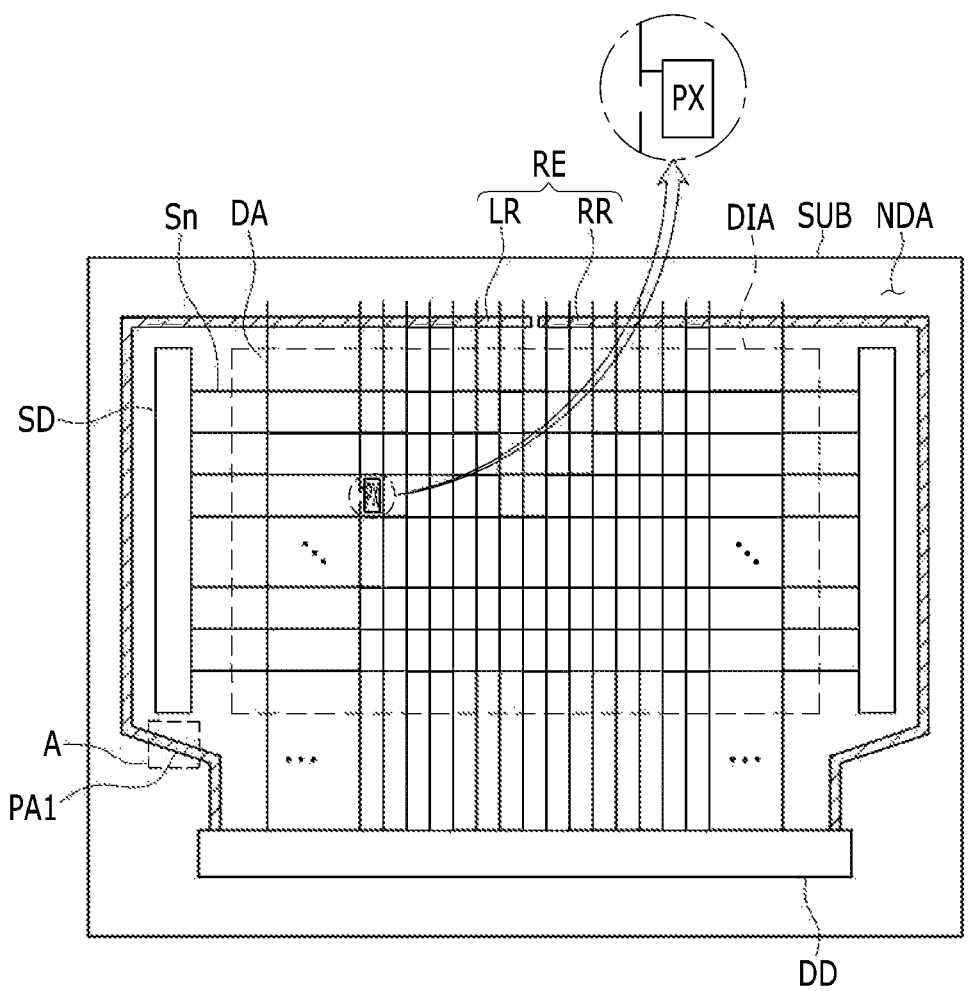
FIG. 7 is a plan view illustrating an OLED display according to another exemplary embodiment.

FIG. 7 is a plan view illustrating an OLED display according to still another exemplary embodiment. FIG. 8 is a plan view illustrating part A of FIG. 7.

Figure 8:
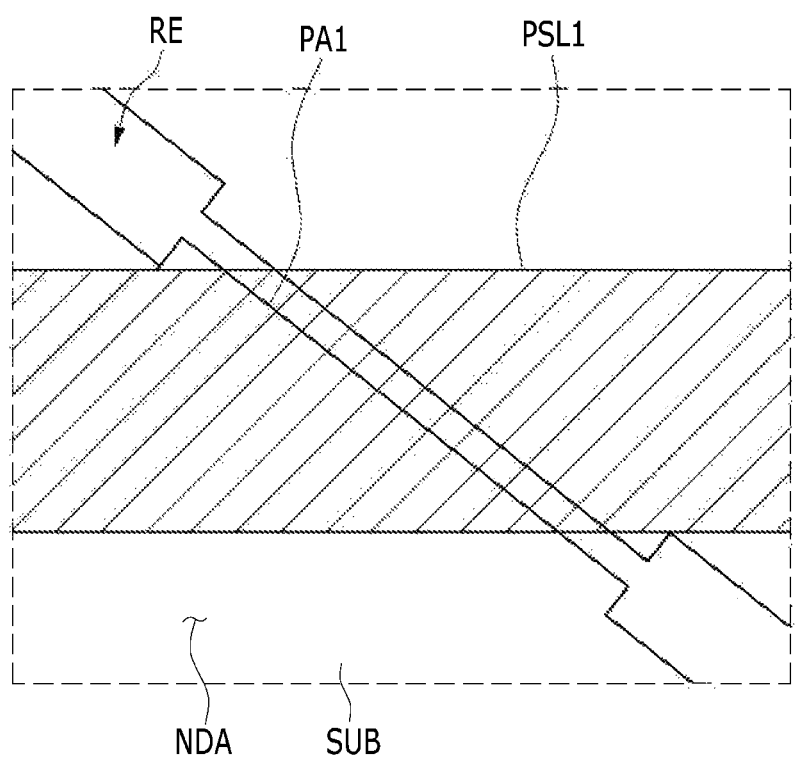
FIG. 8 is a plan view illustrating part A of FIG. 7.

As illustrated in FIGS. 7 and 8, the repair ring RE of the OLED display according to another exemplary embodiment includes one part PA1, and the OLED display further includes a first peripheral signal line PSL1 overlapping one part PA1 of the repair ring RE, which is formed in the peripheral portion NDA.

The first peripheral signal line PSL1 can be a peripheral signal line which is connected to at least one of the lines Sn, Sn-1, Sn-2, EM, Vin, DA, ELVDD, and ELVSS described in the aforementioned exemplary embodiment, and cross one part PA1 of the repair ring RE to overlap one part PAL One part PA1 of the repair ring RE is a part of the repair ring RE adjacent to the driving circuit DD and has a smaller width than another part of the repair ring RE.

One part PA1 of the repair ring RE overlapping the first peripheral signal line PSL1 has the smaller width than another part of the repair ring RE, and as a result, a size of a capacitance formed between one part PA1 of the repair ring RE and the first peripheral signal line PSL1 which overlap each other is minimized.

As a result, since the data signal through one part PA1 of the repair ring RE is minimized from being delayed due to the capacitance formed by the first peripheral signal line PSL1, the voltage drop is suppressed from being generated in the data signal through the repair ring RE.

That is, it is possible to provide the OLED display which suppresses a voltage drop from being generated in a signal through the repair ring RE.

Hereinafter, an OLED display according to yet another exemplary embodiment will be described with reference to FIGS. 9 and 10. Hereinafter, different parts from the OLED display according to the exemplary embodiment described above will be described.

Figure 9:
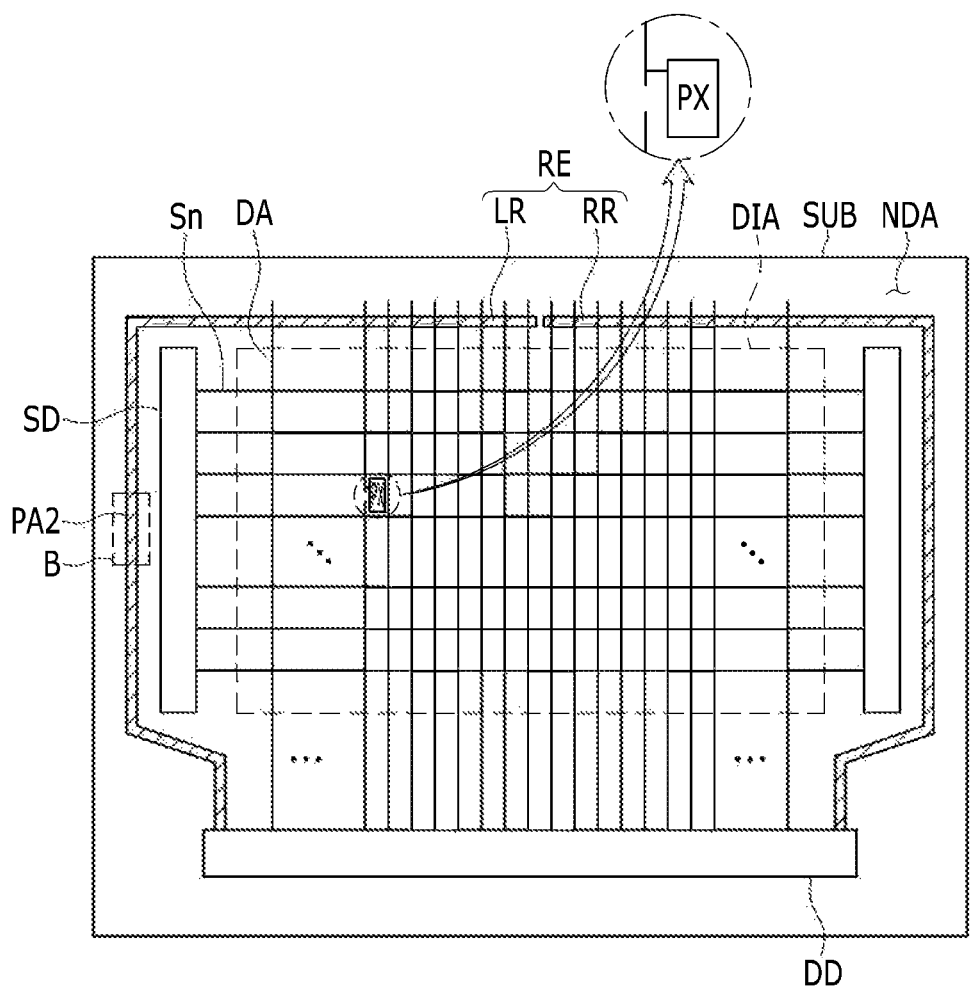
FIG. 9 is a plan view illustrating an OLED display according to yet another exemplary embodiment.

FIG. 9 is a plan view illustrating an OLED display according to yet another exemplary embodiment. FIG. 10 is a cross-sectional view illustrating part B of FIG. 9.

Figure 10:
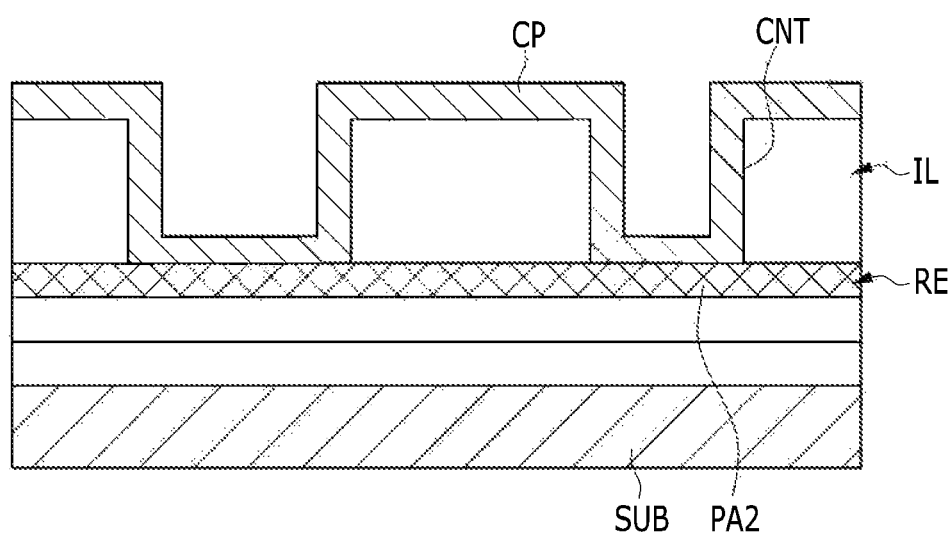
FIG. 10 is a cross-sectional view illustrating part B of FIG. 9.

As illustrated in FIGS. 9 and 10, the repair ring RE of the OLED display according to yet another exemplary embodiment further includes one part PA2.

One part PA2 of the repair ring RE is adjacent to the scan circuit SD, and one part PA2 of the repair ring RE does not overlap the peripheral signal line connected to at least one of the lines Sn, Sn-1, Sn-2, EM, Vin, DA, ELVDD, and ELVSS.

At least a part of one part PA2 of the repair ring RE is exposed by one or more contact holes CNT formed in the insulating layer IL covering the repair ring RE, and the repair ring RE further includes a contact portion CP which extends in a parallel direction with one part PA2 to contact one part PA2 through one or more contact holes CNT.

Here, the repair ring RE can be formed of a conductive layer positioned on the same layer as the aforementioned scan line Sn, and the contact portion CP can be formed by a conductive layer positioned on the same layer as the aforementioned data line DA, but the described technology is not limited thereto and can be formed of various conductive layers.

One part PA2 of the repair ring RE which does not overlap the peripheral signal line contacts the contact portion CP through the contact hole CNT formed in the insulating layer IL, and as a result, electrical resistance of one part PA2 of the repair ring RE is minimized.

As a result, since the data signal through one part PA2 of the repair ring RE is minimized from being delayed due to the electrical resistance of the one part PA2 of the repair ring RE, the voltage drop is suppressed from being generated in the data signal through the repair ring RE.

That is, it is possible to provide the OLED display which suppresses a signal through the repair ring RE from being voltage-dropped.

Hereinafter, an OLED display according to still another exemplary embodiment will be described with reference to FIGS. 11 and 12. Hereinafter, different parts from the OLED display according to the exemplary embodiment described above will be described.

Figure 11:
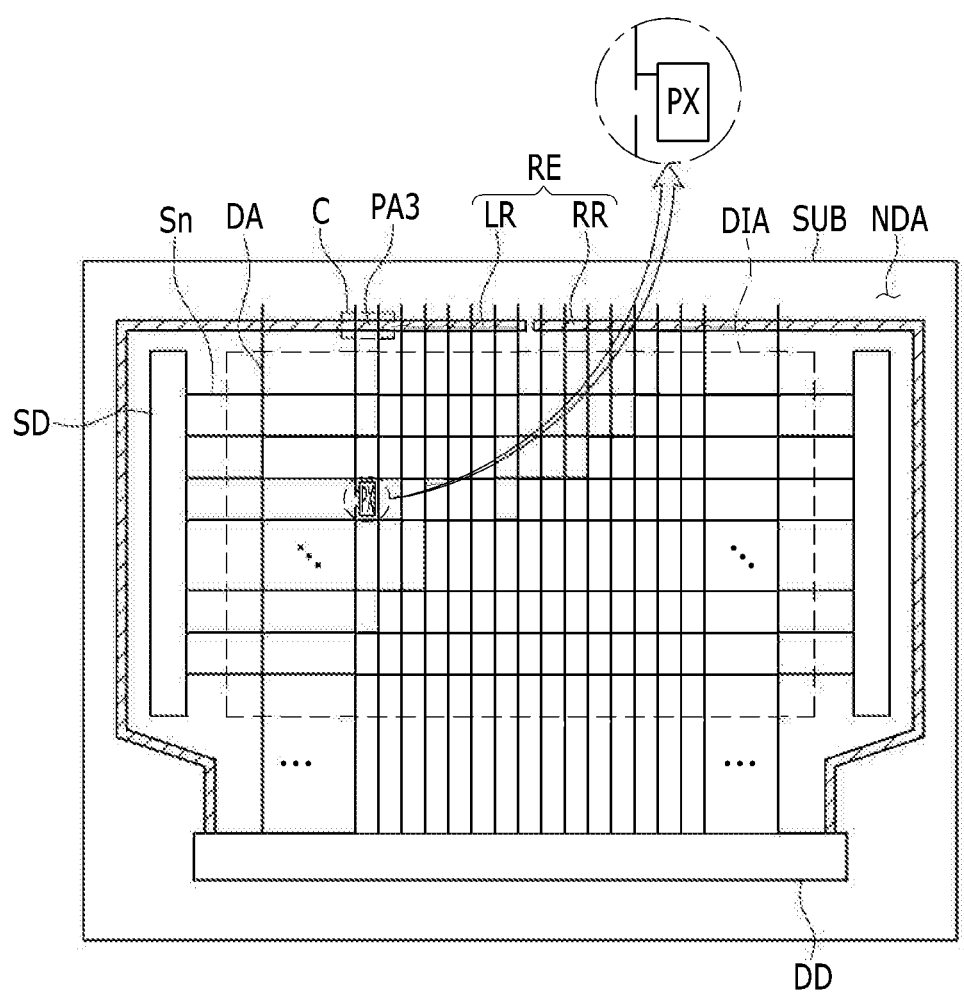
FIG. 11 is a plan view illustrating an OLED display according to still another exemplary embodiment.

FIG. 11 is a plan view illustrating an OLED display according to still another exemplary embodiment. FIG. 12 is a plan view illustrating part C of FIG. 11.

Figure 12:
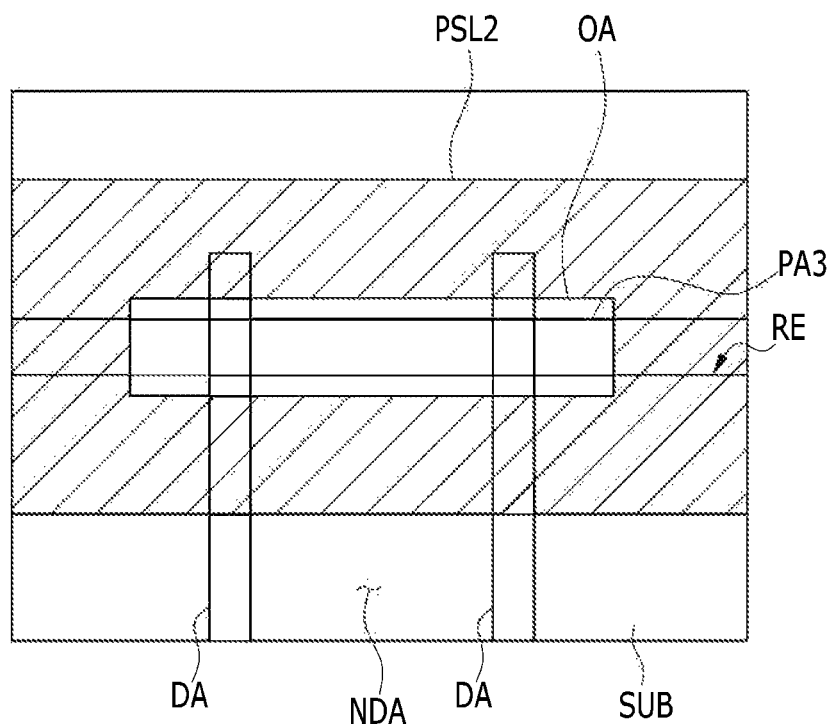
FIG. 12 is a plan view illustrating part C of FIG. 11.

As illustrated in FIGS. 11 and 12, the repair ring RE of the OLED display according to still another exemplary embodiment further includes one part PA3, and the OLED display further includes a second peripheral signal line PSL2 including an opening OA corresponding to one part PA3 of the repair ring RE, which is formed in the peripheral portion NDA.

The second peripheral signal line PSL2 can be a peripheral signal line which is connected to at least one of the lines Sn, Sn-1, Sn-2, EM, Vin, DA, ELVDD, and ELVSS, and includes the opening OA corresponding to one part PA3 of the repair ring RE.

One part PA3 of the repair ring RE is a part of the repair ring RE which is spaced apart from the driving circuit DD with the display portion DIA therebetween and a part crossing the data lines DA in the peripheral portion NDA.

The second peripheral signal line PSL2 includes the opening OA at the portion corresponding to one part PA3 of the repair ring RE to prevent the capacitance from being formed between one part PA3 of the repair ring RE and the second peripheral signal line PSL2.

As a result, since the data signal through one part PA3 of the repair ring RE is prevented from being delayed due to the capacitance formed by the second peripheral signal line PSL2, the voltage drop is suppressed from being generated in the data signal through the repair ring RE.

While the inventive technology has been described in connection with what is presently considered to be practical exemplary embodiments, it is to be understood that the described technology is not limited to the disclosed embodiments, but, on the contrary, is intended to cover various modifications and equivalent arrangements included within the spirit and scope of the appended claims.

What is claimed is:

1. An organic light-emitting diode (OLED) display, comprising:
    a substrate including a display area displaying an image and a peripheral area surrounding the display area;
    a plurality of scan lines on the substrate;
    a plurality of data lines crossing the scan lines;
    a plurality of pixels on the display area and electrically connected to the scan lines and the data lines;
    a repair ring formed in the peripheral area and surrounding the display area, wherein the repair ring includes a first line and a connecting line different from the first line, and wherein the first line has a width less than that of the connecting line different from the first line; and
    a driving circuit transferring a data signal to the data lines and the repair ring.

2. The OLED display of claim 1, further comprising a first peripheral signal line formed in the peripheral area and overlapping the first line of the repair ring in the depth dimension of the OLED display.

3. The OLED display of claim 2, wherein the first line of the repair ring is located adjacent to the driving circuit.

4. The OLED display of claim 2, wherein the connecting line comprises a pair of connecting lines, wherein the first line has opposing ends respectively connected to the connecting lines, and wherein the connection lines do not overlap the first line in the depth dimension of the OLED display.

5. The OLED display of claim 1, further comprising an insulating layer on the repair ring and including at least one contact hole, wherein the repair ring further includes a second line overlapping the contact hole.

6. The OLED display of claim 5, wherein the repair ring further includes a contact portion on the repair ring, and wherein the contact portion contacts the second line through the contact hole.

7. The OLED display of claim 5, further comprising a scan circuit formed in the peripheral area and electrically connected to the scan lines, wherein the second line of the repair ring is located adjacent to the scan circuit.

8. The OLED display of claim 1, wherein the repair ring further includes a third line crossing the data lines in the peripheral area, and wherein a second peripheral signal line is disposed in the peripheral area and includes an opening corresponding to the third line of the repair ring.

9. The OLED display of claim 8, wherein the third line of the repair ring is spaced apart from the driving circuit with the display area interposed therebetween.

10. The OLED display of claim 1, wherein the driving circuit further transfers the data signal transferred to an error data line of the data lines to the repair ring.

11. The OLED display of claim 1, wherein the repair ring comprises a left repair ring and a right repair ring.

12. The OLED display of claim 10, wherein the left and right repair rings respectively correspond to left and right halves of the display area.

13. The OLED display of claim 11, wherein the left repair ring is electrically connected to a left portion of the driving circuit, and wherein the right repair ring is electrically connected to a right portion of the driving circuit.

14. An organic light-emitting diode (OLED) display, comprising:
    a substrate including a display area displaying an image and a peripheral area surrounding the display area;
    a plurality of scan lines on the substrate;
    a plurality of data lines crossing the scan lines;
    a plurality of pixels on the display area and electrically connected to the scan lines and the data lines;
    a repair ring formed in the peripheral area and surrounding the display area, wherein the repair ring includes a first line and contacts an insulating layer at least partially covering the repair ring; and
    a driving circuit transferring a data signal to the data lines and the repair ring, wherein the repair ring further includes a contact portion on the substrate and contacts the first line through at least one contact hole.

15. The OLED display of claim 14, further comprising a scan circuit formed in the peripheral area and electrically connected to the scan lines, wherein the first line of the repair ring is located adjacent to the scan circuit.

16. The OLED display of claim 14, wherein the repair ring further includes the a second line different from the first line, wherein the second line crosses the data lines in the peripheral area, and wherein the OLED display further comprises a peripheral signal line formed in the peripheral area and including an opening corresponding to the second line of the repair ring.

17. The OLED display of claim 16, wherein the second line of the repair ring is spaced apart from the driving circuit with the display portion interposed therebetween.

18. An organic light-emitting diode (OLED) display, comprising:
    a substrate including a display area displaying an image and a non-display area surrounding the display area;
    a plurality of scan lines on the substrate;
    a plurality of data lines crossing the scan lines;
    a plurality of pixels on the display area and electrically connected to the scan lines and the data lines;
    a repair ring formed in the non-display area and surrounding the display area, wherein the repair ring includes a portion crossing the data lines in the non-display area;
    a driving circuit transferring a data signal to the data lines and the repair ring; and a peripheral signal line formed in the peripheral area and including an opening corresponding to the portion of the repair ring.

19. The OLED display of claim 18, wherein the portion of the repair ring is spaced apart from the driving circuit with the display portion interposed therebetween.

* * * * *